(12) United States Patent
Weber et al.

(10) Patent No.: US 9,766,550 B2
(45) Date of Patent: Sep. 19, 2017

(54) ACTUATORS AND MICROLITHOGRAPHY PROJECTION EXPOSURE SYSTEMS AND METHODS USING THE SAME

(71) Applicant: Carl Zeiss SMT GmbH, Oberkochen (DE)

(72) Inventors: Ulrich Weber, Ulm (DE); Stefan Hembacher, Bobingen (DE); Armin Schoeppach, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 14 days.

(21) Appl. No.: 14/840,394

(22) Filed: Aug. 31, 2015

(65) Prior Publication Data
US 2015/0370176 A1 Dec. 24, 2015

Related U.S. Application Data

(60) Division of application No. 13/402,115, filed on Feb. 22, 2012, now abandoned, which is a continuation of
(Continued)

(30) Foreign Application Priority Data

Jul. 22, 2008 (DE) .................. 10 2008 034 285

(51) Int. Cl.
*G03F 7/20* (2006.01)
*H02N 1/00* (2006.01)
(Continued)

(52) U.S. Cl.
CPC ......... *G03F 7/70141* (2013.01); *F16H 21/44* (2013.01); *G03F 7/70258* (2013.01);
(Continued)

(58) Field of Classification Search
None
See application file for complete search history.

(56) References Cited

U.S. PATENT DOCUMENTS 4,570,096 A * 2/1986 Hara ...................... H02N 2/023
310/328
4,714,855 A * 12/1987 Fujimoto ............... H02N 2/101
310/328
(Continued)

FOREIGN PATENT DOCUMENTS

DE 19 33 205 1/1971
DE 102 25 266 7/2003
(Continued)

OTHER PUBLICATIONS

Office Action for German Application No. DE 10 2008 034 285.8, with English translation, dated Mar. 12, 2009.
(Continued)

*Primary Examiner* — Steven H Whitesell Gordon
(74) *Attorney, Agent, or Firm* — Fish & Richardson P.C.

(57) ABSTRACT

An actuator includes a housing, a movable part, and an advancing unit that is at least temporarily connected to the movable part. The advancing unit includes a deformation unit and a deformer configured to deform the deformation unit with a vector component perpendicular to an effective direction of the actuator so that a total length of the deformation unit changes in the effective direction of the actuator as a result of the deformation. The movable part is configured to move in the effective direction of the actuator upon a removal of the vector component on the deformation unit and the deformation unit is disposed along the effective direction of the actuator upon the removal of the vector component on the deformation unit.

23 Claims, 11 Drawing Sheets

Related U.S. Application Data application No. 13/009,438, filed on Jan. 19, 2011, now abandoned, which is a continuation of application No. PCT/EP2009/004892, filed on Jul. 7, 2009.

(51) Int. Cl.
*H02N 2/02* (2006.01)
*F16H 21/44* (2006.01)

(52) U.S. Cl.
CPC ......... *G03F 7/70825* (2013.01); *H02N 1/002* (2013.01); *H02N 2/023* (2013.01); *Y10T 74/18992* (2015.01)

(56) References Cited

U.S. PATENT DOCUMENTS

| | | | | |
|---|---|---|---|---|
| 4,874,979 A * | 10/1989 | Rapp | ............... | B82Y 35/00 310/328 |
| 5,027,027 A * | 6/1991 | Orbach | ............... | H02N 2/06 310/317 |
| 5,319,257 A * | 6/1994 | McIntyre | ............... | H02N 2/023 310/328 |
| 5,404,066 A * | 4/1995 | Moriwaki | ............... | B23Q 5/50 310/317 |
| 5,907,212 A * | 5/1999 | Okada | ............... | H02N 2/025 310/316.01 |
| 6,048,307 A * | 4/2000 | Grundl | ............... | H02N 2/023 600/146 |
| 6,437,226 B2 * | 8/2002 | Oudshoorn | ............... | G10G 7/02 84/454 |
| 6,556,364 B2 | 4/2003 | Meehan et al. | | |
| 7,035,056 B2 * | 4/2006 | Franken | ............... | G03F 7/70216 250/492.1 |
| 7,045,932 B2 | 5/2006 | Xu et al. | | |
| 7,309,946 B2 * | 12/2007 | Hwang | ............... | H02N 2/023 310/323.02 |
| 2002/0000518 A1 * | 1/2002 | Oudshoorn | ............... | H02N 2/023 250/454.11 |
| 2004/0263812 A1 | 12/2004 | Hummel et al. | | |
| 2006/0145544 A1 * | 7/2006 | Browne | ............... | F03G 7/065 310/306 |
| 2006/0164619 A1 | 7/2006 | Back et al. | | |
| 2009/0019847 A1 | 1/2009 | Erismis et al. | | |
| 2011/0128521 A1 | 6/2011 | Weber et al. | | |
| 2012/0147344 A1 | 6/2012 | Weber et al. | | |

FOREIGN PATENT DOCUMENTS

| | | |
|---|---|---|
| DE | 103 01 818 | 7/2004 |
| JP | 55-076559 | 6/1980 |
| JP | 09-093961 | 4/1997 |
| JP | 2000-147232 | 5/2000 |
| JP | 2007-215269 | 8/2007 |
| WO | WO 2004/066405 | 8/2004 |

OTHER PUBLICATIONS

International Search Report and Written Opinion for corresponding PCT Appl. No. PCT/EP2009/004892, dated Oct. 9, 2009.
The English translation of the Written Opinion for corresponding PCT Application No. PCT/EP2009/004892, dated Feb. 3, 2011.

* cited by examiner

ACTUATORS AND MICROLITHOGRAPHY PROJECTION EXPOSURE SYSTEMS AND METHODS USING THE SAME

CROSS-REFERENCE TO RELATED APPLICATIONS

This application is a divisional of, and claims priority under 35 USC 120 to, U.S. patent application Ser. No. 13/402,115, filed Feb. 22, 2012, which is a continuation of, and claims priority under 35 USC 120 to, U.S. application Ser. No. 13/009,438, filed Jan. 19, 2011, which is a continuation of, and claims priority under 35 USC 120 to, international application PCT/EP2009/004892, filed Jul. 7, 2009, which claims benefit of German Application No. 10 2008 034 285.8, filed Jul. 22, 2008. U.S. application Ser. No. 13/402,115, U.S. application Ser. No. 13/009,438 and international application PCT/EP2009/004892 are hereby incorporated by reference in their entirety.

BACKGROUND

The disclosure relates to an actuator for high precision positioning and/or manipulation of components, in particular of optical elements or other functional elements in projection exposure systems for semiconductor lithography, and to a method for operating such an actuator. Here, the term "actuator" is to be understood as being synonymous with the terms "final controlling element" and "actuating element" that are likewise used.

There is a regular requirement for the abovenamed components to be positioned and/or manipulated in the nanometer range in order to be able to ensure the overall functionality of the higher level system. It is frequently necessary in this context to monitor the position of the positioned/manipulated components or the alignment thereof in space, with the aid of a high resolution and thus cost intensive and, as the case may be, susceptible measuring and control electronics.

The accuracy of positioning and/or manipulation of conventional systems is chiefly determined not by the actuator technology itself, but by the accuracy of the position measurement. In other words, the actuators can have smaller step widths than can be determined by the position measurement.

However, the step width of the drive of conventional actuators can change as a function of the load that acts on the movable part for the actuator. As a result of this, it can be impossible to calculate the output movement, and so the latter has to be monitored with a measuring system. In addition to this is the fact that slight deviation of the step width can build up over longer travel paths of the actuator.

The problems described are explained below with reference to piezo actuators described in German Published Patent Application DE 100 225 266 A1. DE 100 225 266 A1 describes an actuator for which the actuator movable part (i.e., the moving part of the actuator, which acts on the component that is to be manipulated and/or to be positioned) is driven forward via one or more advancing elements ("feet") that are perpendicular to the movable part. Here, the advancing elements move in the direction of the movable part in a fashion perpendicular to their own longitudinal direction.

Since such a foot also exhibits a certain compliance in the direction of the effective direction of the actuator, the step width that is produced by the foot is a function, on the one hand, of the force that the foot itself can apply (advancing force), and on the other hand of the force against which the foot starts to work, or of the force that exerts tension or pression on the movable part of the actuator.

Consequently, a defined advancing force deflects the foot by a defined absolute value, but owing to the compliance of the foot there is superposed on this deflection a second deflection which results from the load on the movable part.

If, for example, a force acts on the movable part in the direction of advance, the step width becomes larger than the nominal step width, that is to say the step width to which the actuator is designed. If, by contrast, a force acts on the movable part against the effective direction, the step width becomes smaller than the nominal step width. In cases where the load on the movable part changes as the actuator travels, the step width can also change therewith. Consequently, the step width should be checked with an additional high precision displacement sensor but, for reasons of design space and manipulation, this is not always desired or possible.

Another type of high-resolution step drives is the inertial drive. With these drives, an advancing element (e.g., a piezoceramic) pushes the movable part slowly in one direction via a friction contact. In this process, the load on the movable part and the acceleration force on the movable part must be smaller than the transferable frictional force in friction contact. Subsequently, the advancing element is withdrawn with a jerk, the required acceleration force of the movable part being larger for the quick backward movement than the frictional force that can be transferred in the friction contact. The movable part therefore remains stationary, while the advancing element turns back in relation to the movable part. However, such drives have the disadvantage that they can exert only a slight force, since the force on the movable part together with the acceleration force (inertial force) of the movable part is not permitted to exceed the transferable frictional force in the case of the forward movement.

Since, in addition, the movable part cannot be secured when the advancing element is withdrawn with a jerk, the movable part can be "maladjusted" at this instant by an external force on the movable part.

SUMMARY

The disclosure features actuators which, in conjunction with a large force that can be exerted, permit a precise positioning and/or manipulation on actuated components that is largely independent of load.

In general, in one aspect, the invention features actuators having an effective direction that include a housing and a movable part that can be moved in relation to the housing in the effective direction of the actuator, the actuator having an advancing unit that is at least temporarily connected to the movable part. The advancing unit exhibits at least one deformation unit and at least one deformer for deforming the deformation unit; the at least one deformer is suited to deform the deformation unit with a vector component, in particular force component, perpendicular to the effective direction of the actuator in such a way that the total length of the deformation unit changes in the effective direction as a result of the deformation.

The housing can include of least two housing parts that are interconnected via the deformation unit and they can respectively have at least one locking unit with the aid of which the movable part can be locked on the respective housing part.

The deformation unit can have at least one leaf spring, in particular it can be designed as a pair of springs composed of two opposing leaf springs, at least two deformers being able to be arranged on the pair of springs in such a way that they can bend the springs toward one another from outside.

The movable part can have a first and a second partial movable part, the two partial movable parts being connected via the deformation unit designed as part of the movable part.

In this context, at least two locking units can be present which can respectively lock one of the partial movable parts in relation to the housing.

In order to inhibit the movement of the movable part in the effective direction of the actuator, the actuator can have damping elements.

In some embodiments, the deformation unit can have at least one pressurizable tube.

Alternatively, the deformation unit can have at least one temperature-controllable bimetal, a magnetic spiral spring, a wire spring or else a combination of different spiral springs of different cross section and/or different length.

The deformer can have a piezo element, in particular a piezo stack, an electromagnetic coil, a hydraulic or pneumatic cylinder, or else a pneumatic bellows. In addition, the deformer can be designed as a capacitor with capacitor plates whose electric field leads to a deformation of bending elements arranged between the capacitor plates.

In general, in another aspect, the invention features methods for operating an actuator having a movable part that has a deformation unit, the methods including the following steps:
  fixing the movable part by a first locking unit located upstream of the deformation unit seen in the direction of movement of the movable part,
  releasing a second locking unit of the movable part that is located downstream of the deformation unit seen in the direction of movement of the movable part,
  deforming the deformation unit by the deformer,
  fixing the movable part by the second locking unit,
  releasing the first locking unit, and
  releasing the deformer from the deformation unit.

In this context, the individual method steps, in particular the two last set forth, can deviate from the sequence given.

Further advantageous refinements and developments will be apparent from the claims and the embodiments described below.

BRIEF DESCRIPTION OF THE DRAWINGS

FIGS. 6 to 19c show implementations of deformers and deformation elements for applying various technical principles;

Like reference symbols in the various drawings indicate like elements.

DETAILED DESCRIPTION

FIGS. 1a to 1d show an embodiment of an actuator 1. The actuator 1 includes a housing 2 and a movable part 3 that is arranged therein and is held at least temporarily by the locking units 41 and 42. In this context, the locking units 41 and 42 need not necessarily hold the movable part 3 through mechanical contact; it is also possible to apply contactless locking, for example by electric or magnetic forces. Also arranged in the housing 2 are deformers 5 which act on a deformation unit 6. In the example shown, the deformation unit 6 is designed such that it includes of two leaf springs 601 that interconnect the two partial movable parts 31 and 32 of the movable part 3. The mode of operation of the inventive actuator 1 is explained below.

Figure 1A:
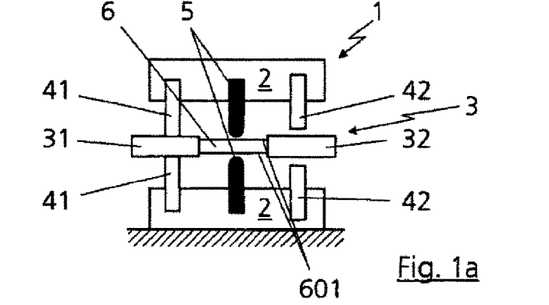
FIGS. 1a to 1d show an embodiment of an actuator.

FIG. 1a shows the first step in moving the movable part 3 in relation to the housing 2. In the method step shown in FIG. 1a, the movable part 3 is fixed on its partial movable part 31 by means of the locking units 41; the right-hand partial movable part 32 can be moved freely; the locking units 42 are open. The deformers 5, which act in a fashion perpendicular to the effective direction of the actuator 1, and therefore perpendicular to the direction of movement of the movable part 3, are also retracted into the housing 2.

Figure 1B:
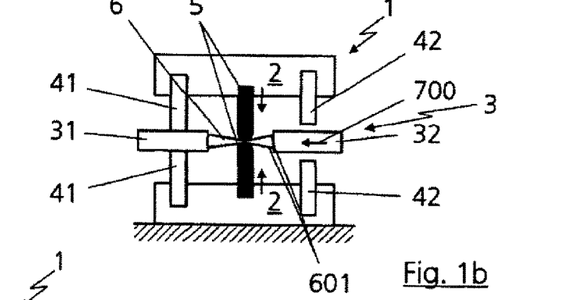

In the second method step, illustrated in FIG. 1b, the two deformers 5 are extended and deform the leaf springs 601, which are arranged opposite one another, toward one another so that a shortening of the movable part 3 in the direction of the arrow 700 occurs as a result of the deflection of the two leaf springs 601. In other words, the right-hand partial movable part 32 vibrates to the left, in the direction of the left-hand partial movable part 31.

Figure 1C:
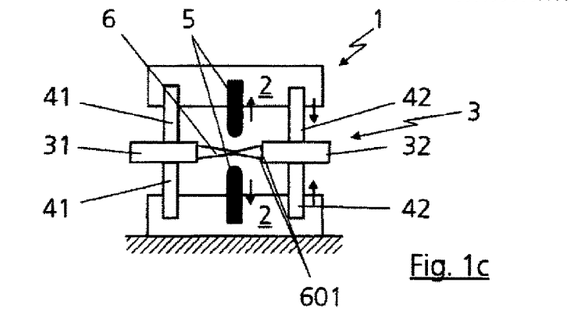

In the method step illustrated in FIG. 1c, the right-hand partial movable part 32 is locked by the associated locking units 42, while the deformers 5 are again drawn into the housing 2 and release the leaf springs 601, although the locking units 41 by means of which the left-hand partial movable part 31 is held are still closed in this state, and so the left-hand movable part 31 still cannot move, as a result.

Figure 1D:
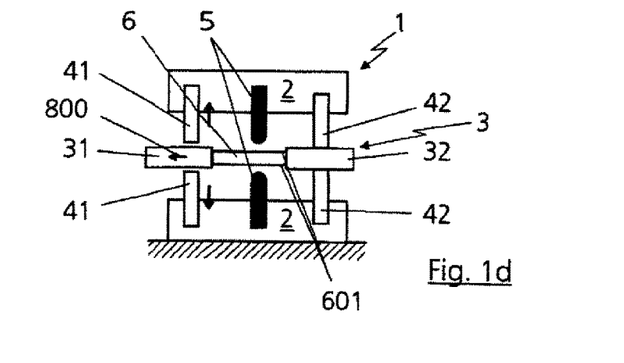

It is not until the fourth method step illustrated in FIG. 1d that the left-hand locking units 41 are opened and release the left-hand partial movable part 31 which, as a result, executes a movement to the left in the direction of the arrow 800. This concludes a complete cycle relating to the movement of the movable part 3 in relation to the housing 2 of the actuator 1.

The steps illustrated in FIGS. 1a to 1d can in principle be repeated for as long as is allowed by the geometric conditions of the actuator 1, in particular the expansion of the leaf springs 601 in the effective direction of the actuator 1. It is also possible to operate the actuator 1 illustrated in FIG. 1 in the direction both of tension and of compression, that is to say to connect either the right-hand partial movable part 32 or the left-hand partial movable part 31 to an element to be moved.

It may be seen from FIGS. 1a to 1d that the geometry of the actuator 1, and in particular the fact that the leaf springs 601 are actuated in a fashion perpendicular to the effective direction of the actuator (that is to say, perpendicular to the direction of the arrows 700 and 800) has the advantageous effect of producing, on the one hand, a high speed reduction ratio and, on the other hand, a high stiffness of the actuator 1 in the effective direction.

The maximum force that can be applied by the actuator 1 illustrated in FIGS. 1a to 1d corresponds in this context to the Euler buckling load of the leaf springs 601 for a compressive operation of the actuator 1; this restriction does not exist for a tensile operation of the actuator, but the maximum tensile force to be applied is restricted substantially by the force to be applied by deformers 5, and by the E modulus of the leaf springs 601.

The very high speed reduction ratio also enables the maintenance of a constant defined step width irrespective of the load on the movable part 3 by using a deformation restriction to precisely define the relatively large deformation of the leaf springs 601 perpendicular to the effective direction, with the result that the step width in the effective direction is also very precisely determined by the high speed reduction ratio. By way of example, this deformation restriction can be realized in the FIGS. 1a to 1d by virtue of the fact that the leaf springs 601 are caused to sag until they abut one another.

FIGS. 2a to 2d show a variant of the invention in the case of which the travel path of the movable part 3 is virtually unrestricted. In the variant illustrated in FIGS. 2a to 2d, the housing of the actuator 1 is designed in two parts consisting of the two housing parts 21 and 22 which are interconnected via the leaf springs 601. In this case, arranged in the first housing part 21 are the first locking units 41, while the second locking units 42 are arranged in the second housing part 22. Likewise located in the first housing part 21 are the deformers 5, which act on the leaf springs 601 in a fashion substantially analogous to the variant illustrated in FIGS. 1a to 1d.

Figure 2A:
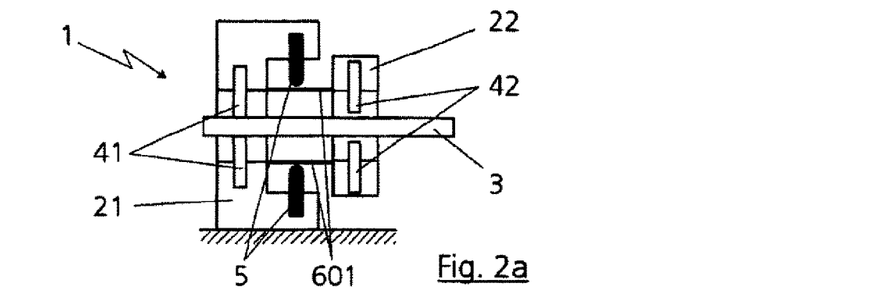
FIGS. 2a to 2d show another embodiment of an actuator in which a virtually unlimited travel path of the actuator is possible.

In the first method step illustrated in FIG. 2a, the left-hand locking units 41 are closed and hold the movable part 3, while the right-hand locking units 42 are open so as to release the right-hand part of the movable part 3. The leaf springs 601 are relaxed, since the deformers 5 are drawn in in the first housing part 21.

Figure 2B:
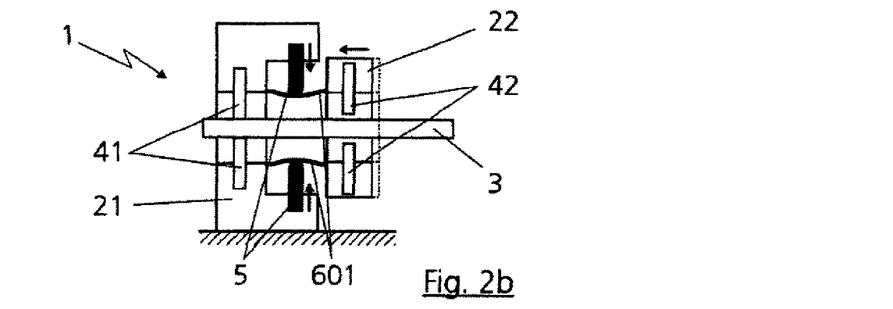
Figure 2C:
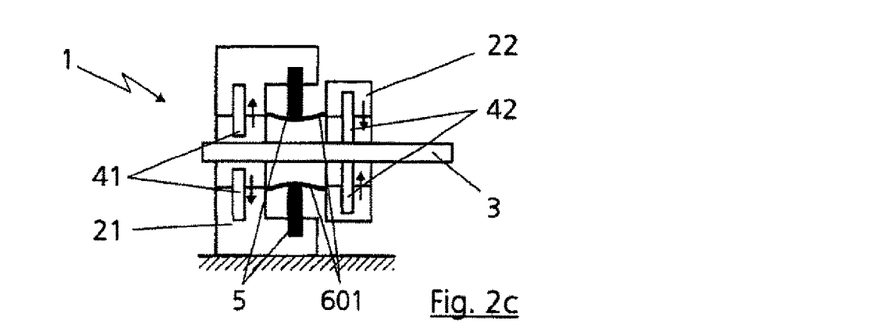
Figure 2D:
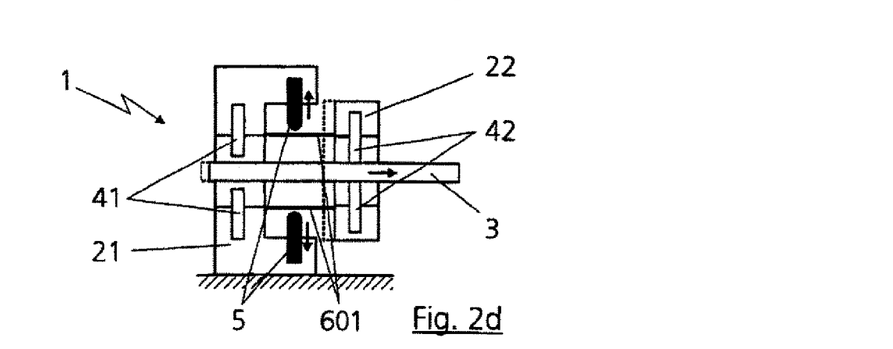

In the second method step illustrated in FIG. 2b, the deformers 5 move out from the first housing part 21 and deform the leaf springs 601 in the way already known from FIG. 1, as a result of which the right-hand housing part 22 with the open locking units 42 moves in the direction of the first housing part 21 along the movable part 3. Subsequently (illustrated in FIG. 2c), the right-hand locking units 42 are closed, as a result of which the movable part 3 and the left-hand locking units 41 are opened. In the last method step, which is illustrated in FIG. 2b, the deformers 5 are withdrawn into the first housing part 21, as a result of which the leaf springs 601 relax. Owing to the fact that in the example shown in FIGS. 2a to 2d the deformation unit 6, that is to say the leaf springs 601, are connected to the housing parts 21 and 22 and not to the movable part 3, it becomes possible to displace the movable part in relation to the housing parts 21 and 22, virtually over an unrestricted distance.

Figure 3:
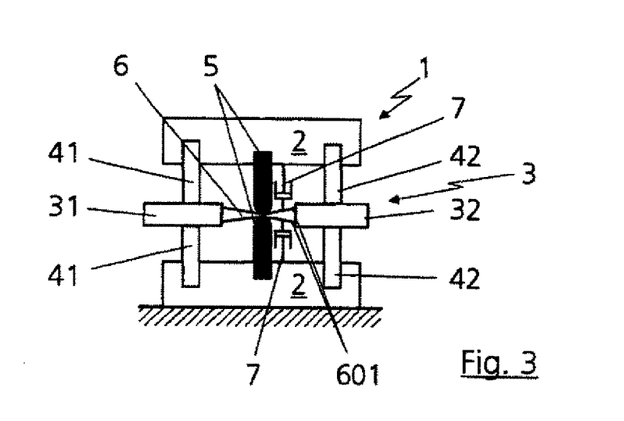
FIG. 3 shows an embodiment of an actuator in which damping elements are used.

Particularly in the embodiment illustrated in FIGS. 1a to 1d, it can happen that when the locking units 41 are released, there is a sudden relaxing of the leaf springs 601, and thus an unexpected impulse is exerted on the actuator 1. This problem can be mitigated or avoided, as illustrated in FIG. 3, by inhibiting the relaxation of the leaf springs 601 and the movement, attended thereon, of the movable part 3 by the use of the dampers 7, thus permitting the above-described impulse to be largely avoided. The dampers 7 can be designed, by way of example, as hydraulic or else as electromagnetic dampers that are designed as immersion coils.

Figure 4A:
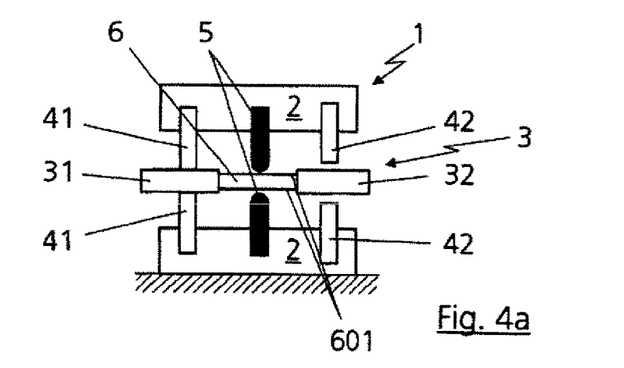
FIGS. 4a to 4e show another embodiment of an actuator.
Figure 4B:
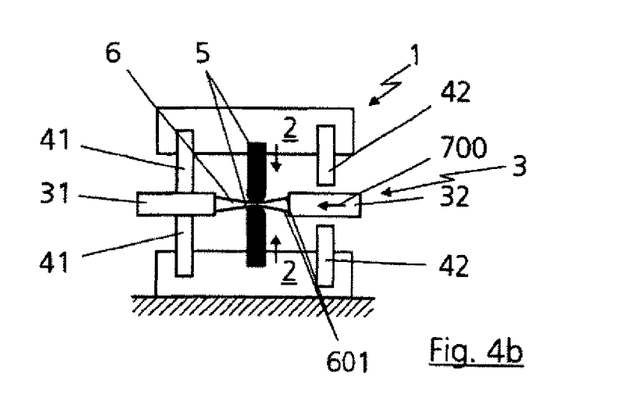
Figure 4C:
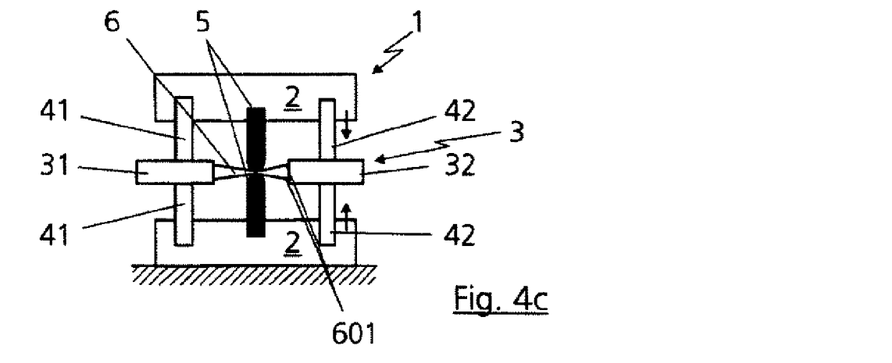
Figure 4D:
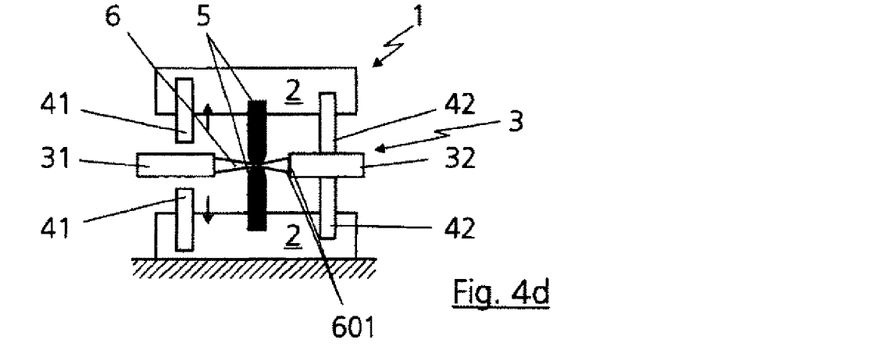
Figure 4E:
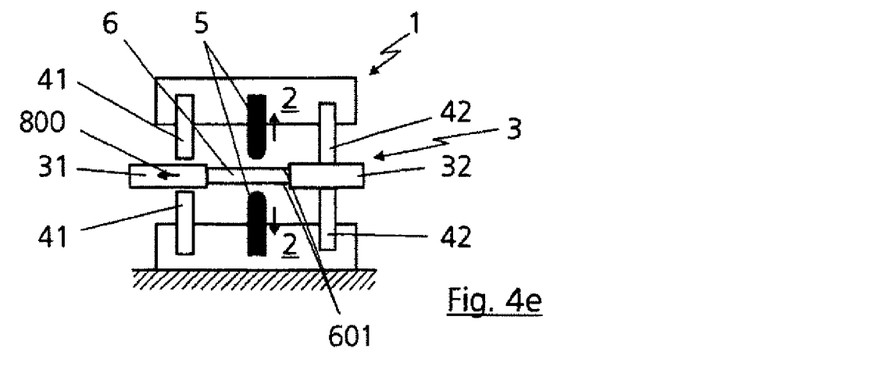

FIGS. 4a to 4e shows an alternative possibility of preventing the impulse upon the relaxation of the leaf springs 601. In essence, the illustration in FIGS. 4a to 4e correspond to the illustration in FIGS. 1a to 1d; as shown in FIG. 4d and FIG. 4e, respectively, the difference being that the leaf springs 601 are not relaxed until the deformation unit 41 has released the left-hand movable part 31. The left-hand movable part 31 can then be controlled by the controlled withdrawal of the deformers 5 in the housing 2.

Figure 5:
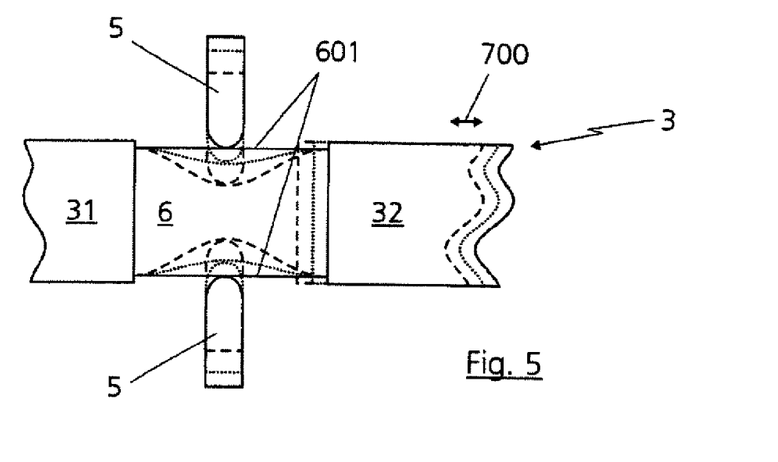
FIG. 5 shows a use of the actuator for high precision setting of paths.
Figure 6:
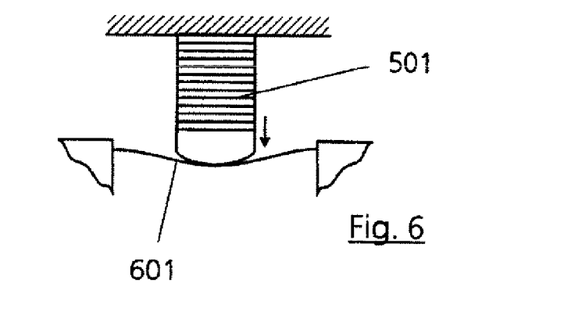
Figure 7:
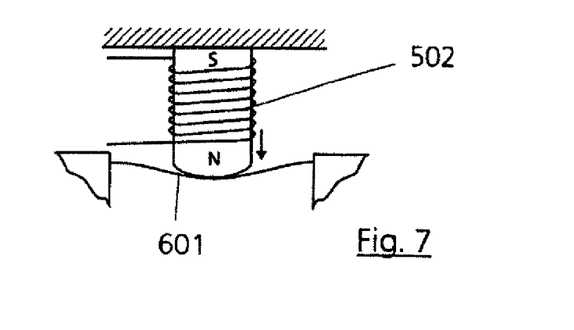
Figure 8:
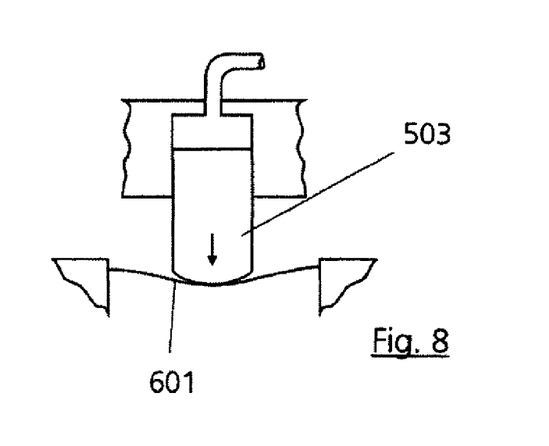
Figure 9:
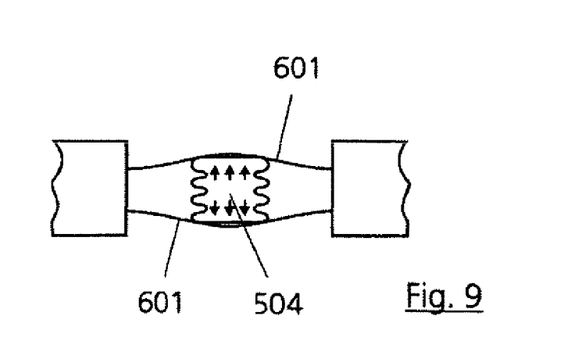

The high speed reduction ratio that is implemented by the actuator 1 also enables a fine adjustment of the movable part 3 or the actuator 1 to be achieved by a doped actuation of the deformers 5, as illustrated in FIG. 5. A comparatively long path of the deformers 5 causes a decidedly short travel path of the movable part 3 owing to the geometric conditions of the invention. Thus, given knowledge of the geometric conditions and material constants, it suffices to measure the travel path of the deformers 5, and then to infer the travel path of the movable part 3 that corresponds thereto. This variant of the invention particularly enables the use of a measuring system of low resolution to monitor the travel path, since only the comparatively large travel path of the deformers 5 need be measured. The conversion into the resulting, substantively smaller travel path of the movable part 3 is less affected by errors because, firstly, the inventive actuator prevents a high speed reduction ratio and, secondly, the actuator is of decidedly stiff design in its effective direction such that the deformation of the movable part 3 in the effective direction depends only to a very small extent on the counterforce applied by the component to be actuated.

If the entire path that is covered by the movable part 3 is composed of a plurality of individual steps, this path can be determined from the sum of the deformation movements by taking account of the precisely known speed reduction ratio between deformer 5 and movable part 3. It is therefore no longer necessary to make available a high precision measuring system for the entire movable part travel path, as is currently required. With the actuator in accordance with the invention, it suffices to this end to make use for the deformer 5 of a measuring system that covers only the small travel range of the deformer 5 and, because of the high speed reduction ratio, has no need of resolution as high as the measuring systems previously used for this purpose.

Various possibilities for embodying the deformation units and deformer are sketched in FIGS. 6 to 19c.

Figure 10:
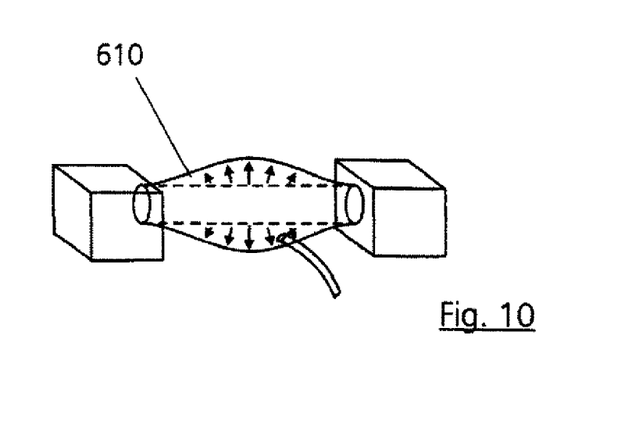

Thus, in FIGS. 6 to 9 the deformation units 6 are implemented as leaf springs 601 (only one leaf spring being illustrated in each case). The deformer is embodied in FIG. 6 as a piezo element 501, in FIG. 7 as an electromagnetic coil 502 with iron core, in FIG. 8 as a hydraulic cylinder with associated hydraulic ram 503, and in FIG. 9 as a pneumatic bellows 504 between the two leaf springs 601. In FIG. 10, the deformation unit is implemented as a thin-walled tube 610 to which a certain pressure can be applied from the tube interior. The tube 610 in this case exhibits a double functionality as bellows and spiral spring.

Figure 11A:
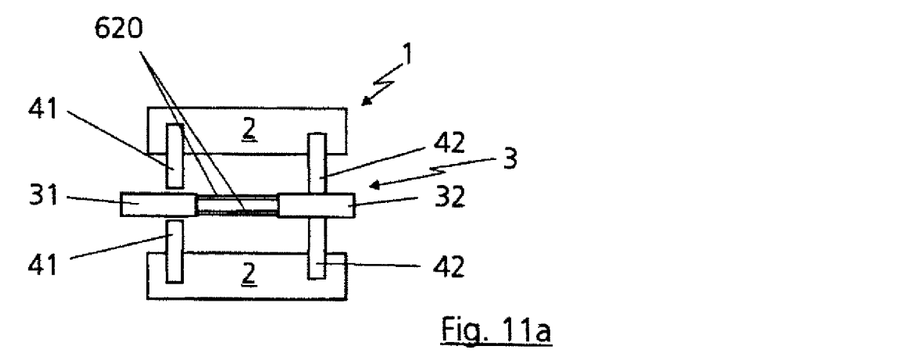
Figure 11B:
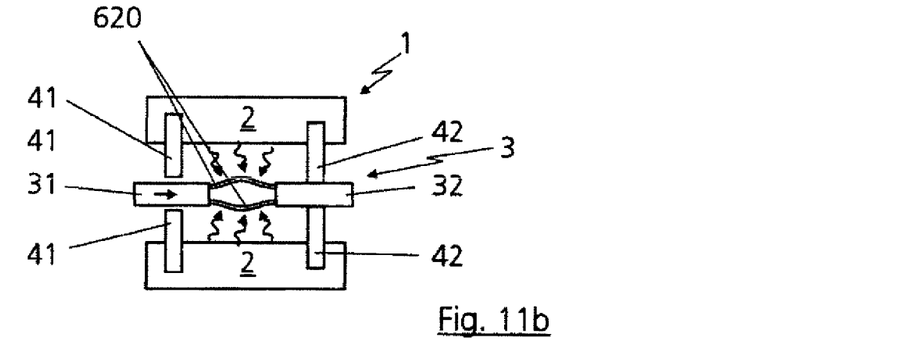
Figure 11C:
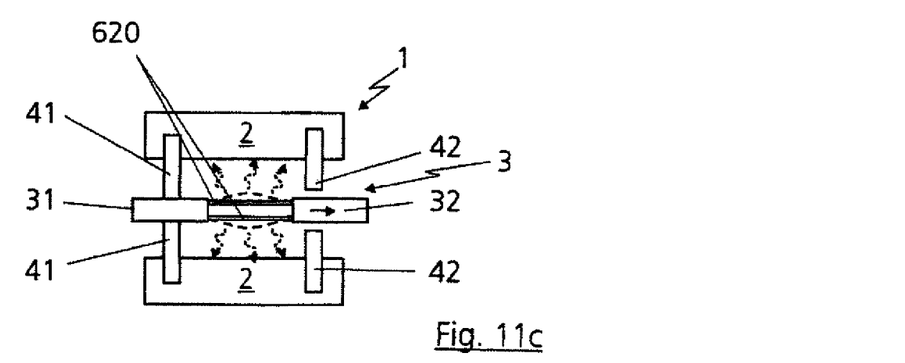
Figure 12:
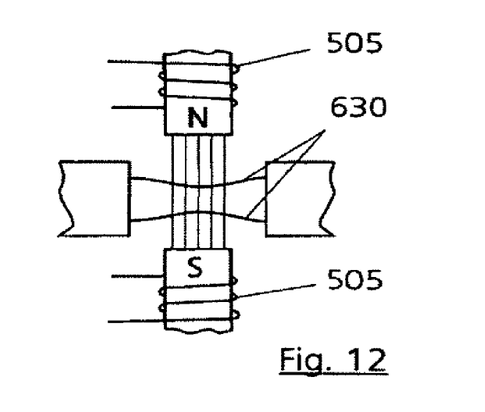

FIGS. 11a to 11c illustrate the possibility of a thermal drive in which the deformation unit 6 is implemented as a pair of bimetal strips. The sagging of the bimetal strips 620 takes place in this case through the supply and removal of heat, as illustrated in sub FIGS. 11b and 11c. FIG. 11a shows the arrangement in the neutral state. Likewise, the deformation unit can be represented as a combination of two magnetic coils 505 with the magnetic spiral springs 630, as illustrated in FIG. 12.

Figure 13:
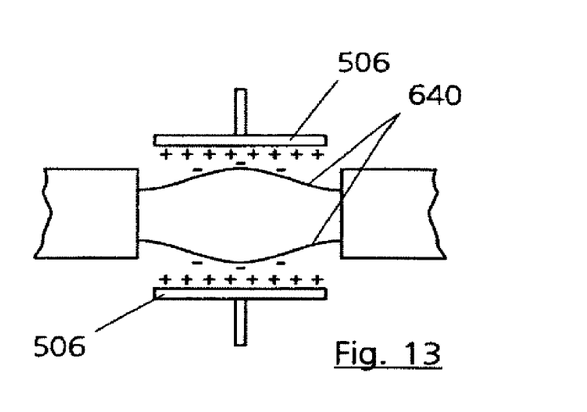
Figure 14:
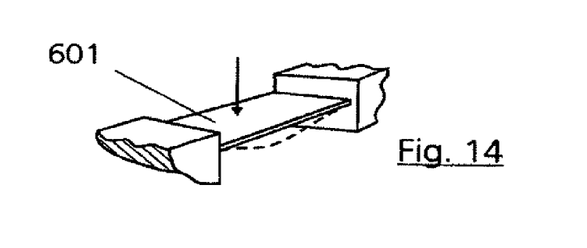
Figure 15:
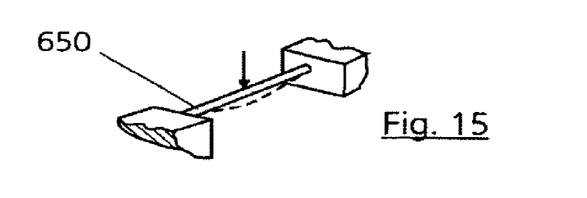

In addition, it is also possible to use as deformer a capacitor with capacitor plates 506 whose electric field leads to a deformation of the bending elements 640 arranged between the capacitor plates 506.

Figure 16:
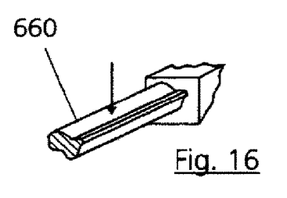
Figure 17:
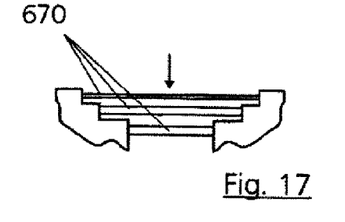

FIGS. 14 to 19*c* show further possibilities for forming deformation element 6. The possibility, already presented, of a leaf spring 601 is presented in FIG. 14, whereas a wire spring 650 is used in FIG. 15. As illustrated in FIG. 16, it is also possible to consider a deformation element 660 with any desired cross section. FIG. 17 shows a variant in the case of which use is made as deformation element of a combination of various spiral springs 670 of different cross section and different length, this enabling an adaptation of the actuator effect to the respectively prevailing requirements for the use of the inventive actuator.

Figure 18:
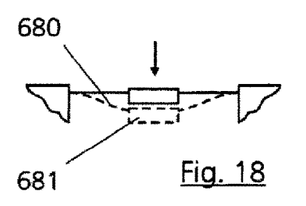

FIG. 18 shows a possibility where, in the effective direction of the actuator, the deformation unit has at least two sections with different elastic properties. This is implemented by virtue of the fact that a solid intermediate piece 681 is arranged in the spiral spring 680. A defined bearing surface for the deformers not illustrated in FIG. 18 is provided by the solid intermediate piece 681. As a result, defined conditions for the action of force of the deformers on the deformation element prevail over a restricted region even in the case of a sideways movement of the movable part.

Figure 19A:
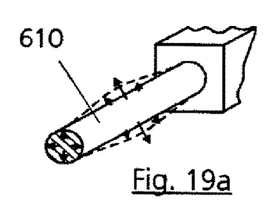
Figure 19B:
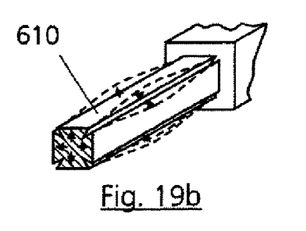
Figure 19C:
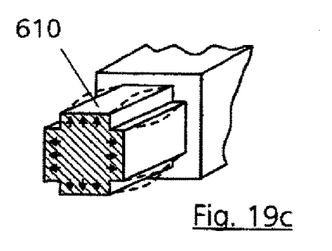

FIGS. 19*a* to 19*c* shows various possibilities for configuring as deformation element 610 a thin-walled tube to which pressure can be applied from inside.

Figure 20:
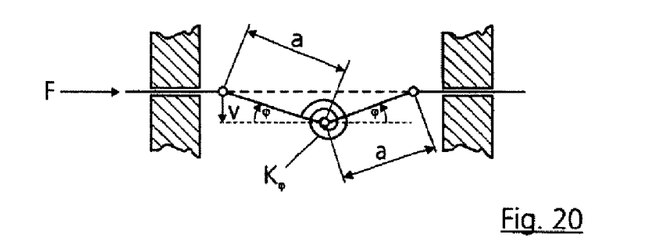
FIG. 20 is a schematic diagram illustrating a principle of actuator operation.

The functional principle of the largely load-independent movable part step width can be explained with the aid of FIG. 20:

The movable part with deformation unit is simulated by an equivalent mechanical model that consists of four rods which are interconnected by three pivot joints, a torsion spring being arranged in parallel with the middle pivot joint.

The inner rods respectively have the length a; the torsion spring has the torsion spring stiffness of $k_\phi$.

The rod outside on the right is secured by a locking unit, while the rod outside on the left is guided linearly (for example by an open locking unit).

The deformer has deflected the middle pivot joint via the path v, the inner rods thereby adopting the angle $\phi$ to the horizontal.

Acting on the rod outside on the left is the force F, which exerts on the middle pivot joint the bending moment $M_{bend}$ that tends to bend the middle pivot joint. The bending moment $M_{bend}$ results from the offset of the path v and the force F $$M_{bend}=F*v.$$

The path v is a function of the bending angle $2*\phi$ of the middle pivot joint via the length a of the inner rods, specifically $$v=a \sin [(2*\phi/2]=a*\sin(\phi).$$

A linearization can be adopted as an approximation for small paths v and angle $\phi$ for more specifically $$v=a*\phi.$$

The bending moment $M_{bend}$ can therefore be represented as a function of half the bending angle $\phi$ of the middle pivot joint, specifically $$M_{bend}=F*a*\phi.$$

On the other hand, the torsion spring exerts on the middle pivot joint the extending moment $M_{extend}$ that tends to extend the pivot joint and the overall movable part.

The extending moment $M_{extend}$ is given by the bending angle $2*\phi$ of the middle pivot joint and the torsion spring stiffness $k_\phi$, specifically $$M_{extend}=k_\phi*2*\phi=2*k_\phi*\phi.$$

The movable part is again extend completely when the bending moment $M_{bend}$ is smaller than the extending moment $M_{extend}$, specifically:

$$M_{bend}<M_{extend}$$

$$F*a*\phi<2*k_\phi*\phi$$

$$F*a<2*k_\phi.$$

The inequality yields for the force F a bound that the force F may not exceed such that the movable part is again completely extended.

This bound is the critical force $F_{crit}$, specifically $$F<(2*k_\phi)/a=F_{crit}.$$

Under the condition that the force F is smaller than the critical force $F_{crit}$ and remains so, the movable part again will extend completely such that the step width of the movable part, which results from the extending movement of the movable part, is independent of the force F.

The independence of the step width from the force F can be explained by virtue of the fact that the extending moment $M_{extend}$ about the zero position (extended position) of the movable part grows more strongly than the bending moment $M_{bend}$ when the force F is smaller than the critical force $F_{crit}$.

For a real leaf spring, the critical force $F_{crit}$ corresponds to the Euler buckling load in the corresponding case of buckling load.

In addition that the deformation unit need not necessarily have elastic components. It is likewise conceivable that the deformation of the deformation unit is performed by a deformer that can exert both pressure and tension. This would then require the deformation itself not necessarily to apply a restoring force.

Because of its high stiffness, its high positioning forces and its largely load-independent step width, the actuator is suitable for areas of use in which, given a very high required positioning accuracy, a measurement of the position of the object to be adjusted in order to drive the actuator can be implemented only with great difficulty, or there is a need to position very large masses.

Figure 21:
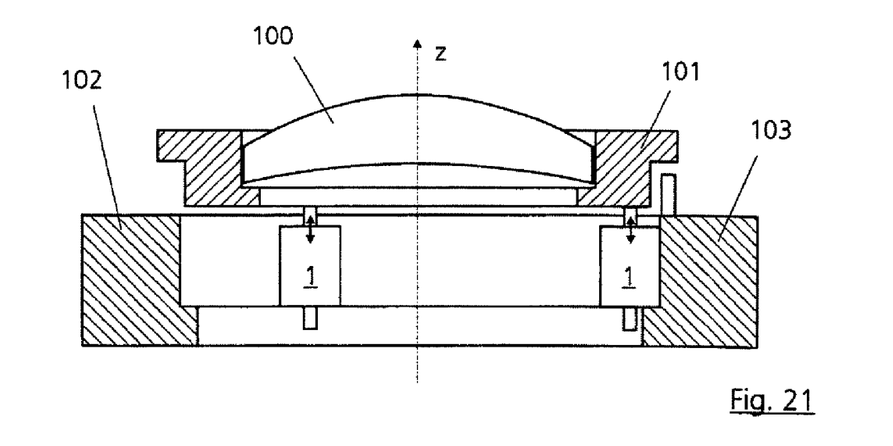
FIG. 21 shows an embodiment of a z-manipulator for a projection exposure system for semiconductor lithography using an actuator.

These requirements exist, for example, in the case of z-manipulators in a semiconductor lithography objective, which in order to correct aberrations position lenses very accurately in the z-direction before operation begins, and finely set the lenses in the z-direction about this position in real time during operation, in order to correct aberrations that are caused by fluctuation in the operating environment; an example is given in FIG. 21.

A z-manipulator can in this case be designed such that a lens 100 is mounted in an inner ring 101 that is, in turn, supported by three actuators 1 in accordance with the invention, whose effective direction is oriented parallel to the z-direction.

The three actuators 1 are embedded in an outer ring 102 that, in its outer region, forms the interface to the objective structure (not illustrated).

Owing to the high actuating stiffness, the actuators 1 can support the inner ring 101 together with the lens 100 directly in the z-direction, without the system composed of lens 100, inner ring 101 and actuators 1 becoming susceptible to oscillation.

The sensor for the middle position 103 can be used to place the actuator 1 approximately in the middle position again after a power failure.

In order to correct aberrations before operation, the actuators 1 can move the lens 100 into the z-position in stepping mode, a sensor which records exactly the z-position of the lens 100 not being required, since the step width is fairly accurately defined owing to its far reaching load independence. In order to reach the desired z-position, however, there is a need to count the number of steps executed.

The actuator 1 can be used in the fine adjustment mode in accordance with FIG. 5 for the fluctuations about the middle z-position.

Figure 22:
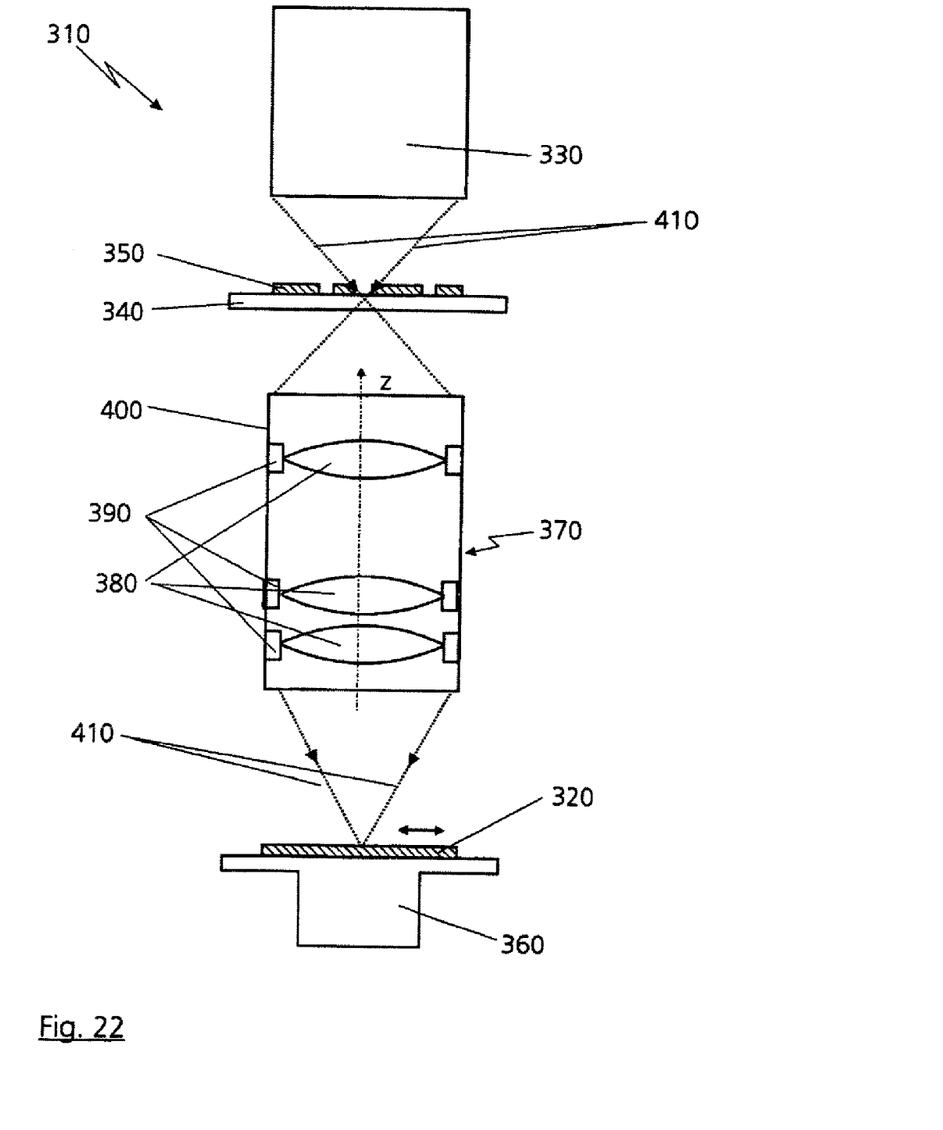
FIG. 22 shows an embodiment of a projection exposure system for semiconductor lithography.

FIG. 22 illustrates a projection exposure system 310 for semiconductor lithography in which use is made of an actuator, such as those described above. The system serves to expose structures on a substrate that is coated with photosensitive materials and generally consists mostly of silicon and is denoted as wafer 320, for the purpose of producing semiconductor components such as, for example, computer chips.

The projection exposure system 310 includes an illumination system 330, a device 340 for holding and exactly positioning a mask, a so-called reticle 350, provided with a structure from which the later structures on the wafer 320 are determined, a device 360 for holding, moving and exact positioning just this wafer 320, and an imaging device, specifically a projection objective 370, having a plurality of optical elements 380 that are supported via mounts 390 in an objective housing 400 of the projection objective 370.

The fundamental functional principle provides in this case that the structures inserted into the reticle 350 are imaged onto the wafer 320; the imaging is executed with the demagnification.

After performance of exposure, the wafer 320 is moved further in the direction of the arrow such that a multiplicity of individual fields are exposed on the same wafer 320, in each case having the structure prescribed by the reticle 350. Owing to the stepwise advancing movement of the wafer 320 in the projection exposure system 310, the latter is also frequently designated as a stepper.

The illumination system 330 provides a projection beam 410, for example light or a similar electromagnetic radiation, for imaging the reticle 350 on the wafer 320. A laser or the like can be used as the source for this radiation. Radiation is shaped in the illumination system 330 via optical elements such that when impinging on the reticle 350 the projection beam 410 has the desired properties with regard to diameter, polarization, shape of the wave front and the like.

The beams 410 generate an image of the reticle 350 that is transmitted on the wafer 320 by the projection objective 370 in an appropriately demagnified fashion, as has already been explained above. Projection objective 370 has a multiplicity of individual refractive, diffractive and/or reflective optical elements 380 such as, for example, lenses, mirrors, prisms, closure plates and the like. In this case, one or more of the optical elements can be arranged in a manipulator in the manner of the manipulator illustrated in FIG. 21.

The z-direction is indicated in the present illustration in accordance with FIG. 21.

Other embodiments are in the following claims.

What is claimed is:

1. An actuator, comprising:
    a housing;
    a movable part; and
    an advancing unit that is at least temporarily connected to the movable part, the advancing unit comprising:
        a deformation unit; and
        a deformer configured to deform the deformation unit with a vector component perpendicular to an effective direction of the actuator so that a total length of the deformation unit changes in the effective direction of the actuator as a result of the deformation,
    wherein:
        the movable part is configured to move in the effective direction of the actuator upon a removal of the vector component on the deformation unit;
        the housing comprises two housing parts configured to be interconnected via the deformation unit; and
        the two housing parts are moveable with respect to each other along the effective direction of the actuator.

2. The actuator of claim 1, wherein the deformer comprises a piezoelectric element.

3. The actuator of claim 1, wherein each housing part comprises a locking unit configured to lock the moveable part to the housing part.

4. The actuator of claim 3, wherein the deformation unit comprises a leaf spring.

5. The actuator of claim 3, wherein the deformation unit comprises a pair of springs comprising two opposing leaf springs, and two deformers are arranged on the pair of springs and configured to bend the leaf springs toward one another from outside.

6. The actuator of claim 1, wherein the movable part comprises first and second partial movable parts connected via the deformation unit.

7. The actuator of claim 6, further comprising two locking units, wherein each locking unit is configured to lock a corresponding partial movable part relative to the housing.

8. The actuator of claim 1, further comprising damping elements configured to inhibit movement of the movable part in the effective direction of the actuator.

9. The actuator of claim 1, wherein the deformation unit comprises at least one element selected from the group consisting of a pressurizable tube, a temperature-controllable bimetal, a magnetic spiral spring, and a wire spring.

10. The actuator of claim 1, wherein the deformation unit comprises a combination of different spiral springs of different cross section and/or different length.

11. The actuator of claim 1, wherein the deformation unit comprises two sections with different elastic properties in the effective direction of the actuator.

12. The actuator of claim 1, wherein the deformer comprises at least one element selected from the group consisting of an electromagnetic coil, a hydraulic cylinder, a pneumatic cylinder, and a pneumatic bellows.

13. The actuator of claim 1, wherein the deformer comprises a capacitor comprising capacitor plates, which, during use, generate electric field that lead to a deformation of bending elements arranged between the capacitor plates.

14. A system, comprising:
    an optical element; and
    an actuator as claimed in claim 1,
    wherein the actuator is configured to move the optical element in a direction of an optical axis of the system, and the system is a semiconductor lithography projection exposure system.

15. The system of claim 14, wherein the optical element is connected to further components of the projection exposure system via the actuator.

16. A method of operating an actuator, the actuator comprising a housing, a movable part, a deformation unit and a deformer, the method comprising:
    fixing the movable part via a first locking unit of a first part of the housing, the first locking unit being located upstream of the deformation unit with respect to a direction of movement of the movable part;

releasing a second locking unit of the second part of the housing, the second locking unit being located downstream of the deformation unit with respect to the direction of movement of the movable part;

deforming the deformation unit via the deformer so that the deformation unit is deformed with a vector component perpendicular to an effective direction of the actuator so that a total length of the deformation unit changes in the effective direction of the actuator as a result of the deformation;

fixing the movable part via the second locking unit;

releasing the first locking unit; and releasing the deformer from the deformation unit so that the moveable part moves in the effective direction of the actuator, the deformation unit is disposed along the effective direction of the actuator upon releasing of the deformer from the deformation unit, wherein the method includes moving the first and second housing parts with respect to each other along the effective direction of the actuator.

17. An actuator, comprising:

a housing comprising two parts;

a movable part;

a deformation unit; and a deformer configured to deform the deformation unit with a vector component perpendicular to an effective direction of the actuator so that a total length of the deformation unit changes in the effective direction of the actuator as a result of the deformation, wherein the deformation unit is connected to the two parts of the housing and not to the movable part so that the movable part can move in relation to the two parts of the housing over an unrestricted distance.

18. The actuator of claim 17, wherein each of the two parts of the housing comprises a locking unit configured to lock the moveable part to the respective part of the housing.

19. The actuator of claim 17, wherein the deformation unit comprises a leaf spring.

20. The actuator of claim 17, wherein the deformation unit comprises a pair of springs comprising two opposing leaf springs, and-two deformers are arranged on the pair of springs and configured to bend the leaf springs toward one another from outside.

21. A system, comprising:

an optical element; and an actuator as claimed in claim 17, wherein the actuator is configured to move the optical element in a direction of an optical axis of the system, and the system is a semiconductor lithography projection exposure system.

22. The system of claim 21, wherein the optical element is connected to further components of the projection exposure system via the actuator.

23. A method of operating an actuator, the actuator comprising a housing, a movable part, a deformation unit and a deformer, the housing comprising two parts connected via the deformation unit, the method comprising:

fixing the movable part via a first locking unit, the first locking unit being located upstream of the deformation unit with respect to a direction of movement of the movable part;

releasing a second locking unit of the movable part, the second locking unit being located downstream of the deformation unit with respect to the direction of movement of the movable part;

deforming the deformation unit via a deformer so that the deformation unit is deformed with a vector component perpendicular to an effective direction of the actuator so that a total length of the deformation unit changes in the effective direction of the actuator as a result of the deformation;

fixing the movable part via the second locking unit;

releasing the first locking unit; and releasing the deformer from the deformation unit so that the moveable part is movable in the effective direction of the actuator over an unrestricted distance.

* * * * *

UNITED STATES PATENT AND TRADEMARK OFFICE
CERTIFICATE OF CORRECTION

PATENT NO. : 9,766,550 B2
APPLICATION NO. : 14/840394
DATED : September 19, 2017
INVENTOR(S) : Ulrich Weber, Stefan Hembacher and Armin Schoeppach It is certified that error appears in the above-identified patent and that said Letters Patent is hereby corrected as shown below:

In the Specification

Column 7, Line 49, delete "a of" and insert -- of --.

Column 7, Line 51, delete "v = a sin" and insert -- v = a*sin --.

In the Claims

Column 12, Line 3, Claim 20, delete "and-two" and insert -- and two --.

Signed and Sealed this
Seventeenth Day of July, 2018

Andrei Iancu
*Director of the United States Patent and Trademark Office*